United States Patent
Scarpa et al.

(10) Patent No.: US 11,438,991 B2
(45) Date of Patent: Sep. 6, 2022

(54) LIGHT EMITTING DIODE PACKAGE AND ELECTRONIC DISPLAY

(71) Applicant: Brightlogic, Inc., Midland Park, NJ (US)

(72) Inventors: John D. Scarpa, Midland Park, NJ (US); Mark Chambers, Romney, WV (US)

(73) Assignee: Brightlogic, Inc., Midland Park, NJ (US)

( * ) Notice: Subject to any disclaimer, the term of this patent is extended or adjusted under 35 U.S.C. 154(b) by 0 days.

(21) Appl. No.: 17/153,604

(22) Filed: Jan. 20, 2021

(65) Prior Publication Data

US 2021/0227674 A1    Jul. 22, 2021

Related U.S. Application Data

(60) Provisional application No. 62/991,622, filed on Mar. 19, 2020, provisional application No. 62/976,854, filed on Feb. 14, 2020, provisional application No. 62/963,564, filed on Jan. 21, 2020.

(51) Int. Cl.
*H05B 47/195*     (2020.01)
*H01L 33/48*      (2010.01)
*G09G 3/32*       (2016.01)

(52) U.S. Cl.
CPC ............. *H05B 47/195* (2020.01); *G09G 3/32* (2013.01); *H01L 33/486* (2013.01); *G09G 2300/0842* (2013.01); *G09G 2360/141* (2013.01)

(58) Field of Classification Search
CPC ........ H05B 47/195; H05B 47/13; G09G 3/32; G09G 2300/0842; G09G 2360/141; G09G 2354/00; H01L 33/486; H01L 25/167; H01L 25/0753
See application file for complete search history.

(56) References Cited

U.S. PATENT DOCUMENTS

| | | | |
|---|---|---|---|
| 6,028,323 A | 2/2000 | Liu |
| 6,489,937 B1 | 3/2002 | Ruvinsky |
| 8,368,112 B2 | 2/2013 | Chan |
| 8,791,471 B2 | 7/2014 | Leung |
| 8,860,049 B2 | 10/2014 | Seo |
| 9,741,286 B2 | 8/2017 | Sakariya |
| 9,836,165 B2 | 12/2017 | Nho |
| 10,161,786 B2 | 12/2018 | Chang |
| 10,303,940 B2 | 5/2019 | Zhang |
| 10,476,234 B2 | 11/2019 | Ryou |
| 10,490,118 B2 | 11/2019 | Komanduri |
| 2002/0175632 A1 | 11/2002 | Takeguchi |

(Continued)

*Primary Examiner* — Renan Luque
(74) *Attorney, Agent, or Firm* — Richard Malagiere, Esq.

(57) ABSTRACT

Disclosed embodiments provide an LED package and electronic display. An LED package can include an LED that emits red, green, blue and IR (infrared), where the IR portion is configured as either an emitter or (reversed biased) as a receiver. An electronic display includes multiple LED packages with the IR portions configured in a combination of transmitters and receivers. Thus, disclosed embodiments enable electronic displays that can serve as interactive video walls and floors that present a high-definition image along with interactive capabilities. Thus, disclosed embodiments serve to reduce cost and complexity in manufacture and deployment of such displays.

15 Claims, 16 Drawing Sheets

(56) References Cited

U.S. PATENT DOCUMENTS

| | | |
|---|---|---|
| 2008/0043101 A1 | 2/2008 | Sharma |
| 2008/0074401 A1 | 3/2008 | Chung |
| 2013/0234175 A1 | 9/2013 | Okda |
| 2015/0228629 A1 | 8/2015 | Tsai et al. |
| 2015/0364107 A1* | 12/2015 | Sakariya ............... G06F 3/042 345/174 |
| 2017/0285860 A1 | 10/2017 | Siddiq et al. |
| 2017/0351336 A1* | 12/2017 | Yang .................. G06F 3/017 |
| 2019/0064953 A1* | 2/2019 | McCoy ................ G06F 3/0386 |
| 2021/0033790 A1* | 2/2021 | Ward .................. G02B 30/28 |

* cited by examiner

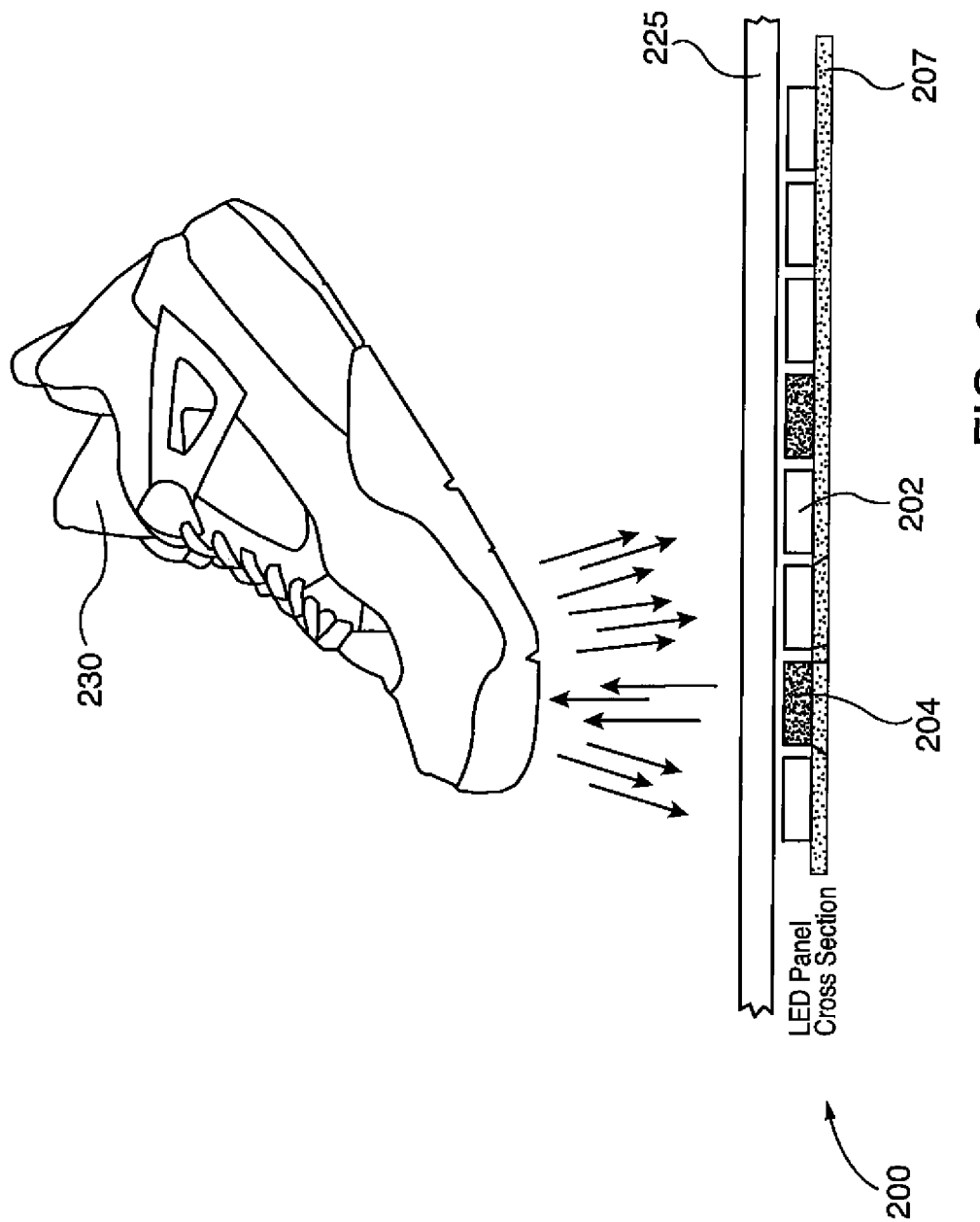

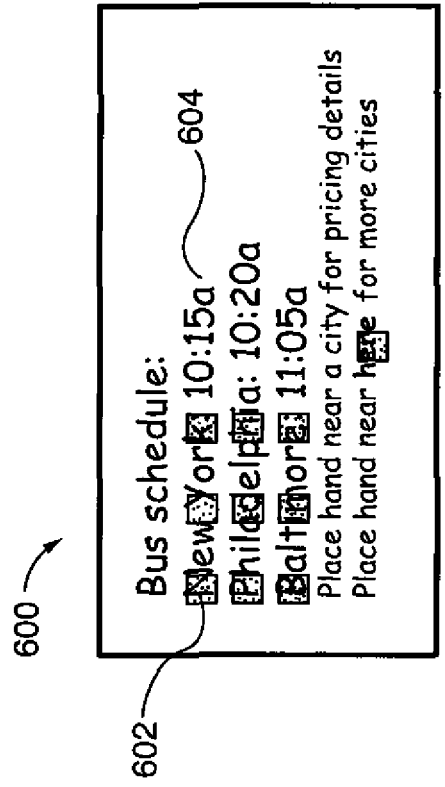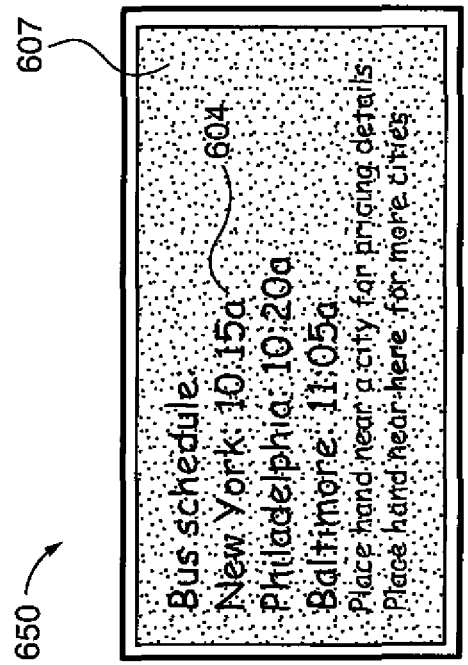
FIG. 6A    FIG. 6B
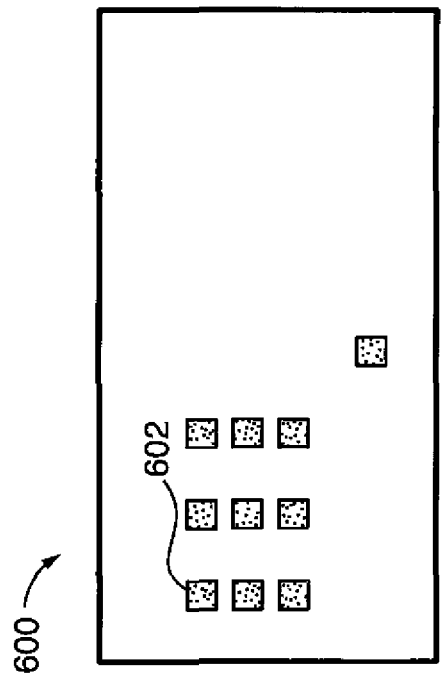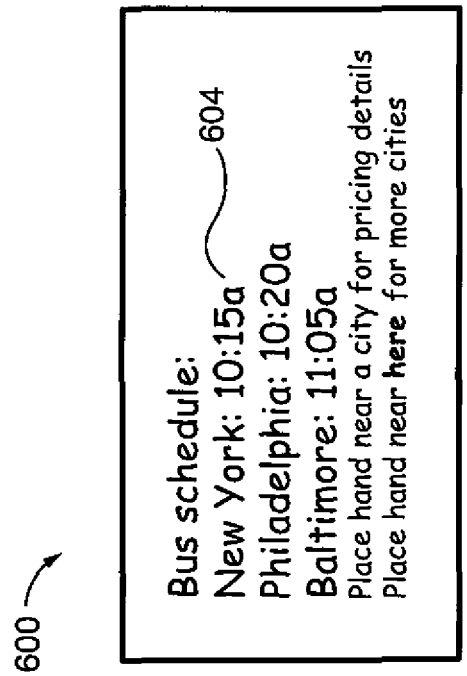
FIG. 6C    FIG. 6D

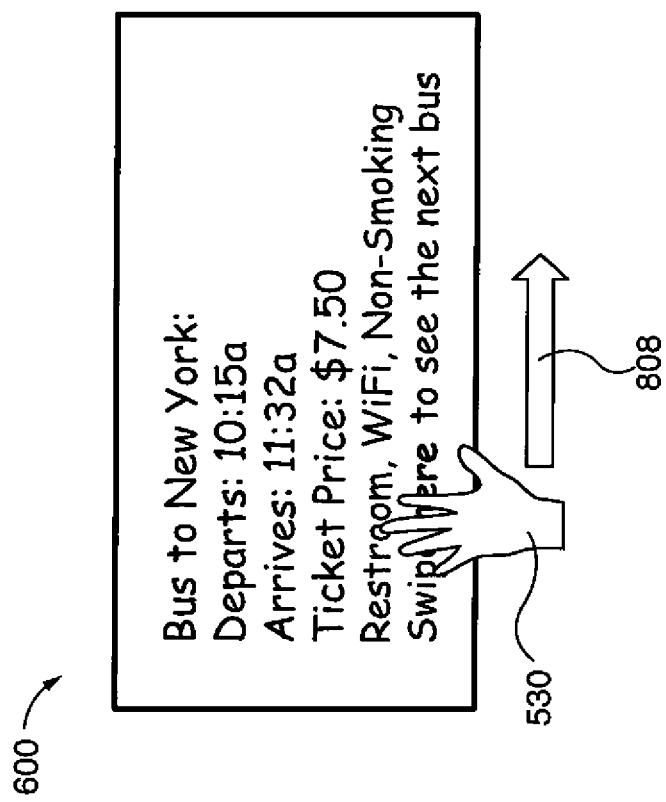

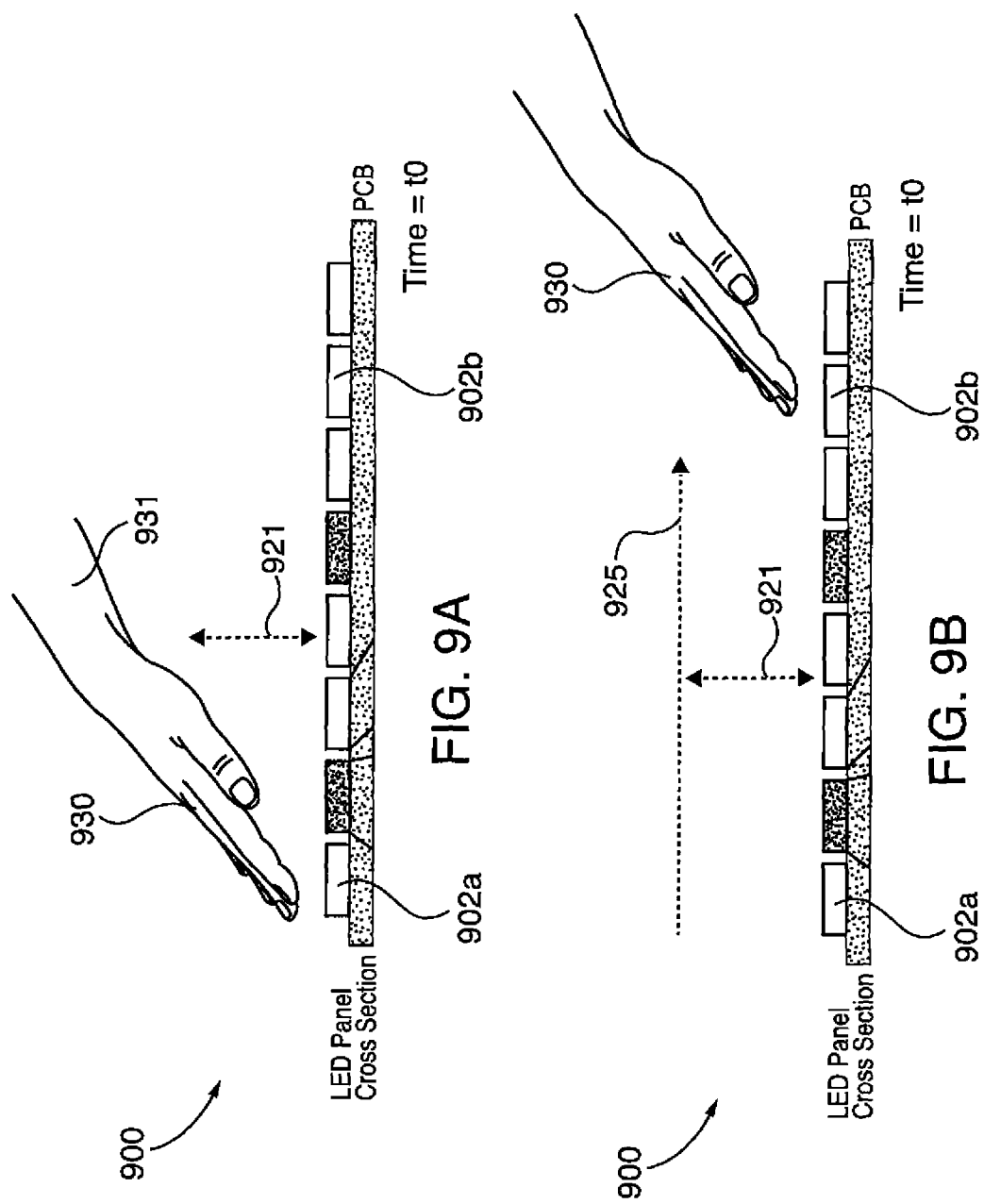

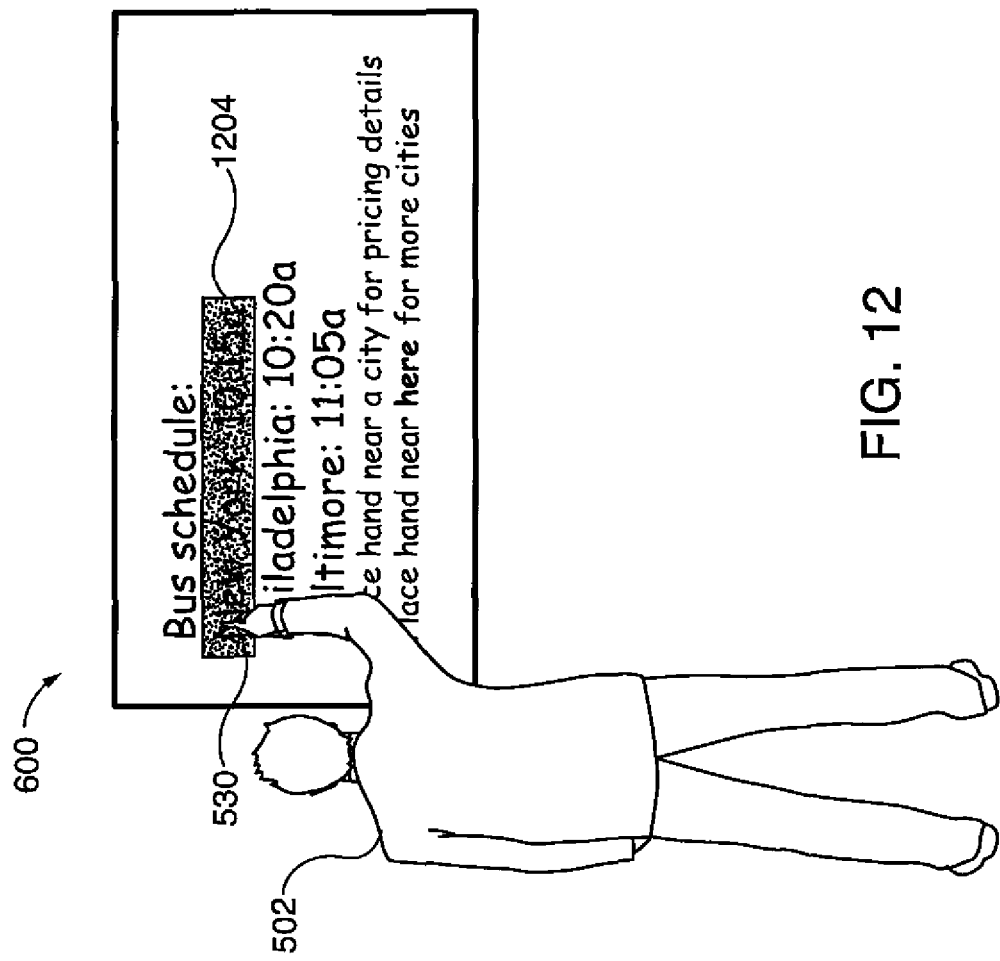

LIGHT EMITTING DIODE PACKAGE AND ELECTRONIC DISPLAY

CROSS-REFERENCE TO RELATED APPLICATIONS

The present patent document claims priority to U.S. provisional patent application Ser. No. 62/963,564, filed Jan. 21, 2020, U.S. provisional patent application Ser. No. 62/976,854, filed Feb. 14, 2020, and U.S. provisional patent application Ser. No. 62/991,622, filed Mar. 19, 2020. The entire disclosures of such applications are incorporated herein by reference.

FIELD

Disclosed embodiments relate generally to electronic display technology, and more particularly, to LED (light emitting diode) electronic displays.

BACKGROUND

An LED display, or light emitting diode display, is a flat panel electronic display that utilizes light emitting diodes to enable the video display. An LED display panel can be fabricated in a variety of sizes for different applications. LED displays can serve as billboards and other digital signage applications. An LED package may include multiple LEDs, whereas an LED display includes multiple LED packages. LEDs used in order to make up LED displays offer several advantages in comparison to other light emitting sources. A light emitting diode is comprised of a semiconductor chip which is surrounded by a transparent plastic case. The plastic case allows the light to pass through it. The emission of different colors including ultraviolet and infrared light depends on the semiconductor material which is used in the diode. As digital information becomes more prevalent, it is desirable to have improvements in LED displays to enable new applications and uses for such displays.

SUMMARY

Embodiments provide an LED (Light Emitting Diode) package comprising: an infrared LED; a red LED; a green LED; and a blue LED; wherein the red LED, blue LED, and green LED are forward biased to be configured as transmitters.

Additional embodiments provide an electronic display device, comprising: a processor; a memory coupled to the processor; an LED (Light Emitting Diode) controller coupled to the processor; a plurality of LED (Light Emitting Diode) packages affixed to a substrate, wherein each LED package of the plurality of LED packages comprises: an infrared LED; a red LED; a green LED; and a blue LED; wherein the red LED, blue LED, and green LED are forward biased to be configured as transmitters, and wherein: a first subset of the plurality of LED packages are configured such that the infrared LED is reverse biased to be configured as a receiver and a second subset of the plurality of LED packages are configured such that the infrared LED is forward biased to be configured as a transmitter.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

FIG. 2 shows a floor-based embodiment of the present invention.

FIG. 6A-6D show examples of a digital signage embodiment.

FIG. 8 shows an example use of swiping in the digital signage embodiment of FIG. 6C.

FIG. 9A and FIG. 9B show an example of swiping.

FIG. 12 shows another example of a digital signage embodiment providing user selection feedback.

DETAILED DESCRIPTION

Disclosed embodiments provide a novel LED package and electronic display. RGB (red, green, blue) LEDS are known in the art. There are also RGBW (red, green, blue, white) LEDS and some others that add a different fourth color. There are also IR (infrared) LEDS in common use in the world (such as in a television remote control). These IR LEDS emit light in the IR spectrum invisible to the human eye. In disclosed embodiments, an LED is configured to be a sensor instead of a transmitter (its normal configuration) by reverse biasing. Accordingly, an IR LED can be reverse biased to become an IR sensor, meaning it can sense the presence or lack of presence of IR light in its vicinity. Disclosed embodiments include an RGB-IR LED package, specifically, an LED that emits red, green, blue and IR. In another embodiment of the present invention, an RGBW-IR LED package is used (where W is a white LED). Additionally, another embodiment includes RGBWW-IR (where WW is a warm white LED) and IR is disclosed. An RGB-IR LED have six wires coming out of its package and the RGBW-IR and RGBWW-IR each have eight wires coming out of its package. In each case, allowing the circuit designer to use the IR portion as either an emitter or (reversed biased) as a receiver.

Since the same LED package that is emitting the RGB video or the RGBW video or the RGBWW video is also be used to sense user activity such as presence of a hand, foot, or other body part or object, disclosed embodiments eliminate the need for individual "sensor only" components to be designed into the circuit board. This facilitates the packing of the LEDS as close together as possible. Thus, disclosed embodiments enable electronic displays that can serve as interactive video walls and floors, of any size, that have a tight enough LED pitch to present a high-definition image. Disclosed embodiments eliminate the cost and manufacturing complexity of dedicated IR sensors (which are not LEDS) inserted between display-generating LEDS or the use of a secondary technology to track movement and then incorporate that information into the control system which handles the display of the video content. Disclosed embodiments seamlessly integrate interactive user interface technology and video display without the needed for dedicated user input detection components. Thus, disclosed embodiments serve to reduce cost and complexity in manufacture and deployment of such displays.

Figure 1A:
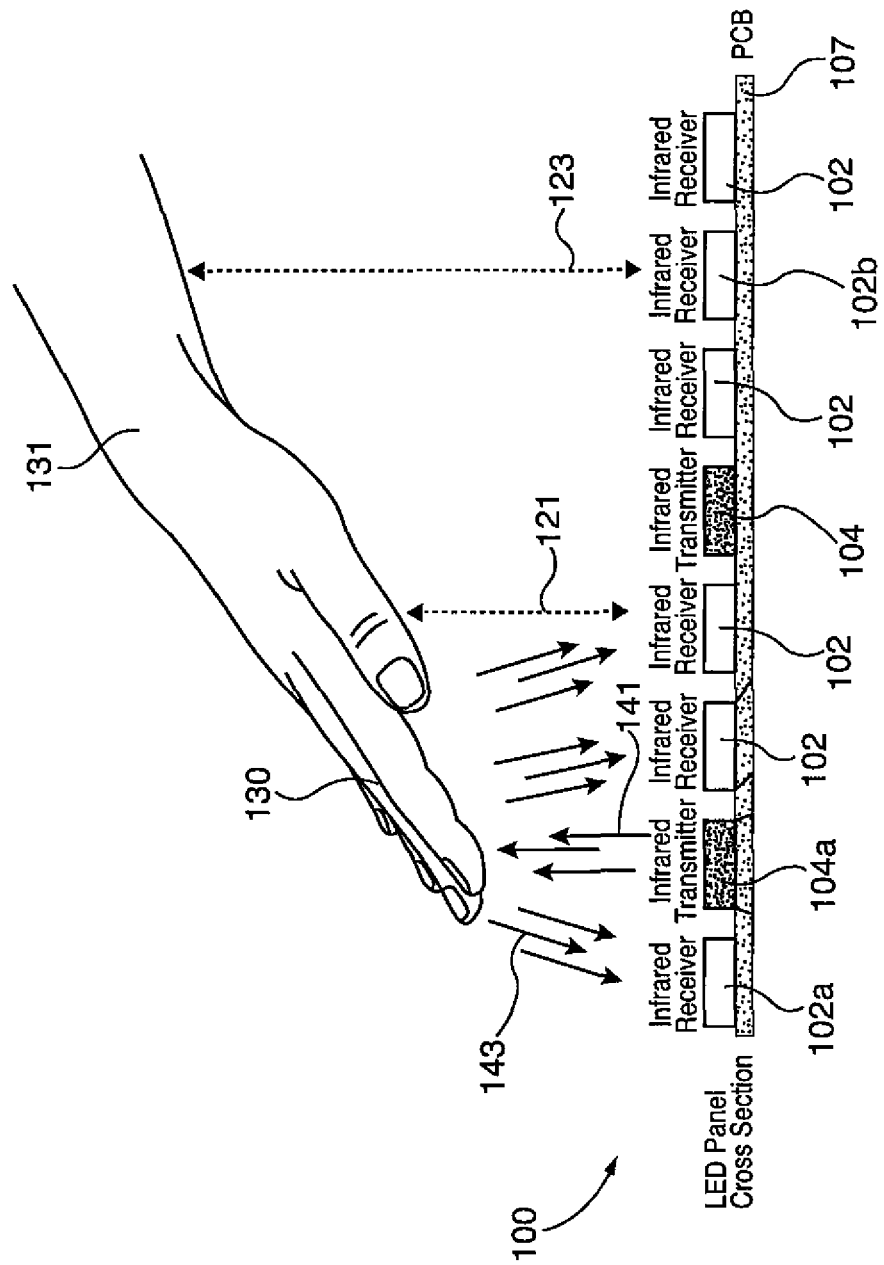
FIG. 1A is a diagram of an embodiment of the present invention.

FIG. 1A is a diagram of an embodiment of the present invention. Electronic display 100 includes a substrate 107, which may comprise a printed circuit board (PCB) which provides electrical connections to a plurality of LED packages. The plurality of LED packages, indicated generally as 102 and 104, are affixed to the substrate 107 via soldering or other suitable techniques. The LED packages can include red, green, blue, and infrared LEDs. In some embodiments, the LED package may further include a white or warm white LED as well. Some LED packages may include multiple RGB LED groups and a single IR LED. In some embodiments, the LED packages each include four RGB LED groups and a single IR LED. Other combinations are possible with disclosed embodiments.

In embodiments, LED packages 102 and 104 are identical. However, the LED packages indicated as 102 may be configured differently than the LED packages 104 based on external circuitry on the PCB (substrate) 107 or other connected electronic component. The LED packages 102 have their IR portion reverse-biased such that the IR portion of LED packages 102 act as an IR receiver. Similarly, the LED packages 104 have their IR portion forward-biased such that the IR portion of LED packages 104 act as an IR transmitter.

With disclosed embodiments, when a user places a hand 130 near the display, a change in infrared light is detected by certain LED packages 102 due to reflection of IR light from the hand 130. Thus, transmitted infrared light 141 from specific LED package 104a is reflected from nearby hand 130. The reflected infrared light 143 is detected by specific LED package 102a. In comparison, specific LED package 102b receives comparatively less IR light than LED package 102a, because the distance 123 between arm 131 and the substrate 107 is sufficient to have a reduced intensity of reflected IR light as compared with LED package 102a. As shown in FIG. 1A, the distance 121 between the hand 130 and the substrate 107 is less than that for the arm 131. That is, distance 121 is less than distance 123. Distance 121 is referred to as an "activation distance" which is the maximum distance between the substrate 107 and the activating object (in this example, hand 130). In some embodiments, distance 121 may range from 1 centimeter to 3 centimeters, while distance 123 exceeds 4 centimeters. In this situation, it can be inferred, based on the intensity/amount of received IR light, that a user is interacting with the display at the location of LED package 102a and not interacting with the display at the location of LED package 102b. Thus, as embodiments can detect where a user has placed his/her hand, a variety of interactive electronic display applications are possible. Another advantage of these embodiments is that it may not be necessary for the hand 130 to physically contact the display 100. Rather, simply being within proximity (distance 121) to the display enables interactivity. In a public setting such as a bus station, this can provide improved sanitary conditions, as users do not need to physically touch the screen in order to interact with it. However, it is possible for a user to touch the surface of the LED packages, creating a maximum reflected IR light response.

Figure 1B:
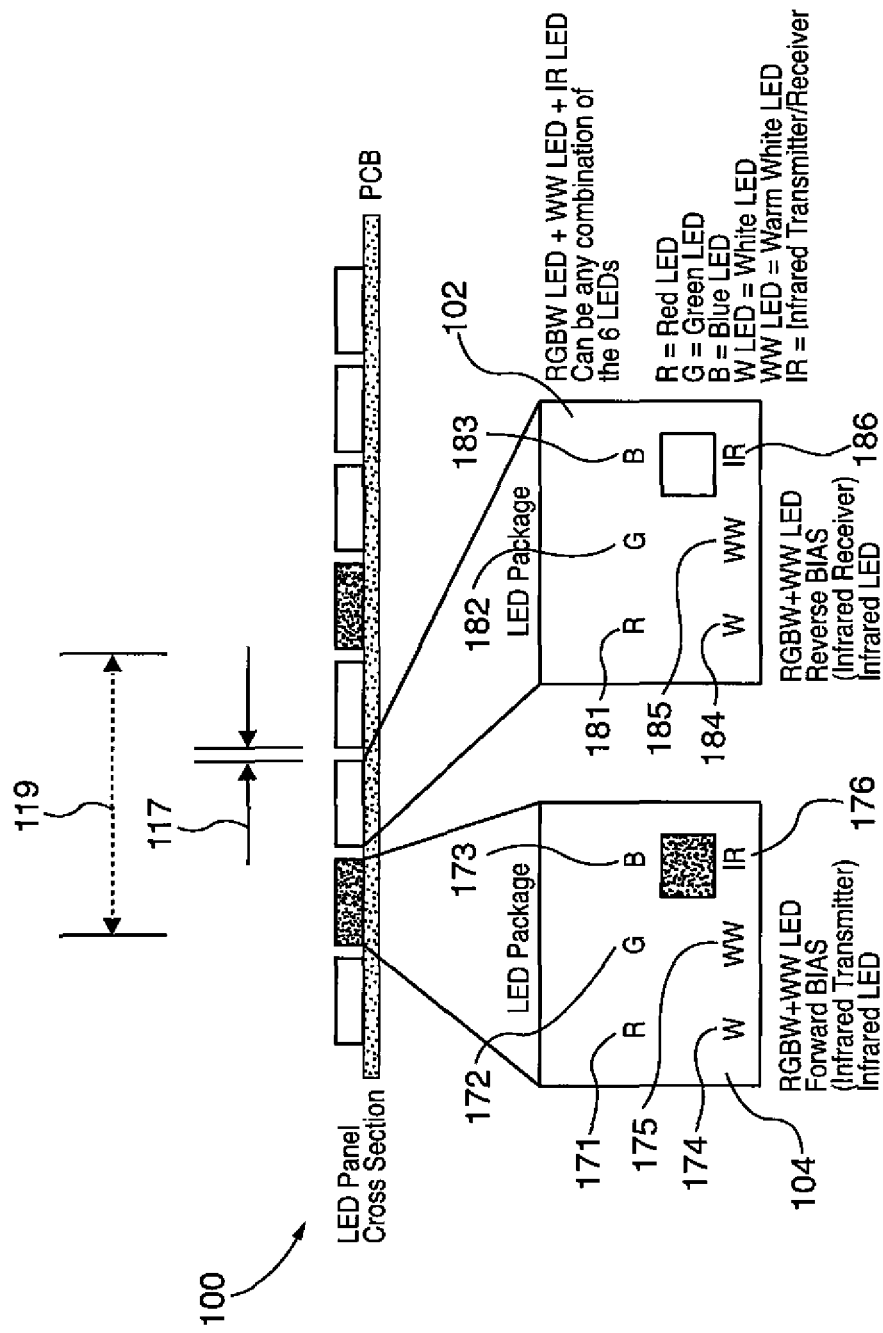
FIG. 1B shows additional details of the embodiment of FIG. 1A.

FIG. 1B shows additional details of the embodiment of FIG. 1A. As can be seen in FIG. 1B, in this embodiment, the LED package 104 includes six LEDs: A red LED 171, a green LED 172, a blue LED 173, a white LED 174, a warm white LED 175, and an IR LED 176. For LED package 104, the IR LED 176 is forward-biased to be configured as a transmitter. In some embodiments, IR LED 176 may be configured to constantly emit IR light. In some embodiments, IR LED 176 may be configured to periodically emit IR light. In some embodiments, the IR LED 176 is configured to emit a periodic pulse of IR light. In some embodiments, the periodic pulse has a duration ranging from 2 milliseconds to 200 milliseconds, and occurs with a periodicity ranging from 300 milliseconds to 800 milliseconds. The periodic configuration can serve to reduce operating power while still providing a responsive user experience. Similarly, the LED package 102 includes six LEDs: A red LED 181, a green LED 182, a blue LED 183, a white LED 184, a warm white LED 185, and an IR LED 186. For LED package 102, the IR LED 186 is reverse-biased to be configured as a receiver.

In embodiments, the red LEDs (171, 181) are configured to emit light in a wavelength ranging from 620 nanometers to 750 nanometers. In embodiments, the green LEDs (172, 182) are configured to emit light in a wavelength ranging from 497 nanometers to 570 nanometers. In embodiments, the blue LEDs (173, 183) are configured to emit light in a wavelength ranging from 450 nanometers to 495 nanometers. In embodiments, the IR LED emits light in a wavelength ranging from 880 nanometers to 950 nanometers. In some embodiments, the IR LED emits light in a wavelength of 940 nanometers.

Correlated color temperature (CCT) defines the color appearance of a white LED. CCT is defined in degrees Kelvin. In embodiments, the white LEDs (174, 184) have a correlated color temperature (CCT) ranging from 2700K to 5000K. In embodiments, the warm white LEDs (174, 184) have a CCT ranging from 2700K to 5000K.

Embodiments may have a fundamental pitch, indicated as 117. The fundamental pitch is a measure of the minimum spacing between two adjacent LED packages. In embodiments, the fundamental pitch ranges from 0.5 millimeter to 5 millimeters. Embodiments may have a transmitter pitch, indicated as 119. The transmitter pitch is a measure of the spacing between two LED packages that are configured as transmitters. In embodiments, the transmitter pitch may be a factor of the fundamental pitch, such as 3× for three times the fundamental pitch. In some embodiments, transmitter-configured LED packages may be non-uniformly distributed throughout a display, based on an application. Thus, if in a particular application, interaction only with the lower left quadrant of a display is required, only that quadrant may comprise LED packages configured as transmitters. Disclosed embodiments can include various combinations of these six LEDs, and some embodiments may have fewer than six LEDs.

Embodiments can include an electronic display device, comprising a plurality of LED (Light Emitting Diode) packages affixed to a substrate, wherein each LED package of the plurality of LED packages comprises: an infrared LED; a red LED; a green LED; and a blue LED; wherein the red LED, blue LED, and green LED are forward biased to be configured as transmitters. A first subset of the plurality of LED packages are configured such that the infrared LED is reverse biased to be configured as a receiver and a second subset of the plurality of LED packages are configured such that the infrared LED is forward biased to be configured as a transmitter. Some embodiments further comprise a white LED, wherein the white LED is forward biased to be configured as a transmitter. Some embodiments further comprise a warm white LED, wherein the warm white LED is forward biased to be configured as a transmitter.

FIG. 2 shows a floor-based embodiment of the present invention. Display 200 may be disposed on a floor. Display 200 comprises a substrate 207 with a plurality of LED packages mounted thereon. The substrate 207 may be a printed circuit board similar to substrate 107. The LED package 204 may be similar to LED package 104 described previously. The LED package 202 may be similar to LED package 102 described previously. The principle of operation for the floor-based embodiment of display 200 is similar to that shown in FIG. 1A and FIG. 1B. In this usage scenario, footwear 230 worn by a user activates certain LED packages based on IR reflection to provide an indication of where on the display 200 a user has stepped. While footwear 230 is shown in FIG. 2, embodiments can also work with bare feet. Furthermore, in addition to floors and walls, embodiments can be used on steps, elevator floors, ramps, and other surfaces where people may step. In some embodiments, an additional protective covering 225 may be disposed over the display 200 to provide additional protection for the display 200. In embodiments, the protective covering 225 may comprise a clear plastic such as polycarbonate or other suitable material.

Figure 3:
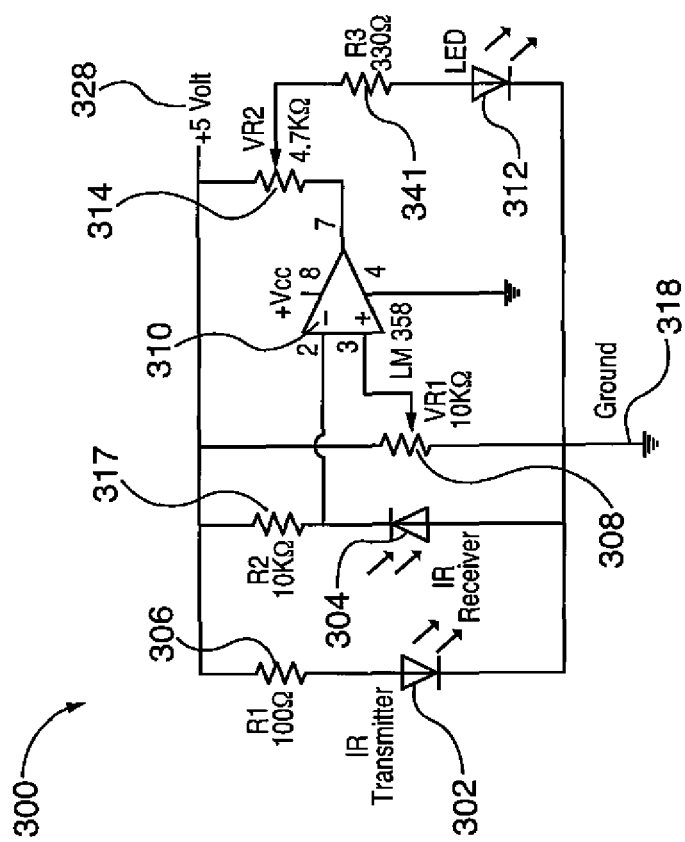
FIG. 3 is a schematic for a circuit in accordance with embodiments of the present invention.

FIG. 3 is a schematic for a circuit 300 in accordance with embodiments of the present invention. Circuit 300 may represent a portion of an LED driver circuit for disclosed embodiments. Circuit 300 performs reverse bias on some IR LEDs to configure them as receivers. Circuit 300 performs forward bias on some IR LEDs to configure them as transmitters. Circuit 300 comprises IR LEDs 302 and 312 which are forward biased to be configured as transmitters. Circuit 300 comprises IR LED 304 which is reverse-biased to be configured a receiver. Circuit 300 includes a connection for a positive voltage supply 328 and a ground connection 318. In embodiments, the positive voltage supply is a 5-volt DC supply. In other embodiments, the positive voltage supply is a 3.3-volt DC supply. Other voltage supply levels are possible in disclosed embodiments. Resistor 306 is connected between IR LED 302 and positive voltage supply 328. In some embodiments, resistor 306 is 100 Ohms. Resistor 317 is connected between IR LED 304 and positive voltage supply 328. In some embodiments, resistor 317 is 10K Ohms. Resistor 341 is connected between LED 312 and variable resistor 314. In some embodiments, resistor 341 is 330 Ohms.

Circuit 300 may further include an operational amplifier 310. In some embodiments, the operational amplifier 310 may be an LM358, manufactured by Texas Instruments. Variable resistor 314 may be configured to provide resistance between an output of the operational amplifier 310 and positive voltage supply 328. Variable resistor 308 may be configured to provide a voltage on an input of the operational amplifier 310. In embodiments, the operational amplifier 310 may be configured as a comparator that changes output state in response to an amount of received IR light exceeding a predetermined level. In embodiments, the variable resistors 308 and 314 may be adjusted as part of a calibration procedure during manufacturing and/or installation of an electronic display in accordance with disclosed embodiments. Circuit 300 represents a portion of the circuitry used to control LEDs of disclosed embodiments. In practice, displays in accordance with disclosed embodiments may comprise many circuit elements to configure each IR LED as a transmitter or receiver, as well as configuring the visible-light LEDs of the packages as transmitters. The visible-light LEDs can include red, blue, green, white, and/or warm white LEDs.

In embodiments, the sensing (detecting) of incoming infrared light is performed using reverse-biased LEDs. An LED can be modeled as a diode in parallel with a small capacitance. The capacitance is formed by the silicon junction that creates the one-direction characteristic of a diode. If a positive voltage and current is injected into the cathode (reverse charge), the capacitance will retain a charge. If this charge is then connected to a high impedance FPGA input, the charge will slowly dissipate into the input. If light is received by the LED, it will produce current in the reverse direction, accelerating the loss of charge. Thus, the input will discharge at a rate proportional to the amount of light falling on the LED sensor, thereby enabling sensing of incoming infrared light.

In embodiments, the functionality of the circuit 300 may be implemented and replicated with a field-programmable gate array (FPGA) integrated circuit chip that is programmed via Verilog, VHDL, or other suitable hardware description language. Thus, in embodiments, the functionality of circuit 300 may be implemented via one or more FPGA chips as part of an LED controller.

The FPGA has the capability to implement a counter to measure the time taken for the input voltage to cross the preset threshold of the digital input. In embodiments, the FPGA performs the following process:

1) Drive the output high, charging the internal capacitance of the LED

2) Disable the output drive, turning the I/O pin into a high impedance input

3) Start a counter, running from some fixed frequency

4) Increment the counter until the input changes from digital '1' to digital '0'

This process correlates the value in the counter with the amount of radiation falling on the LED.

An additional process of disclosed embodiments can include:

1) With emitter (Infrared) LEDs turned off, measure the radiation (infrared light) falling on the sensor as a first level of received infrared light; and 2 With emitter (Infrared) LEDs turned ON, measure the radiation (infrared light) falling on the sensor as a second level of received infrared light.

Step one measures whatever background radiation may be present. Step 2 adds in whatever radiation from the emitter LEDs is reflected back onto the sensor LED. A sensed object, such as a hand, will typically block some background radiation as well as reflecting radiation. Performing the above steps 1 and 2 within a predetermined time interval enables establishment of a reference point for object sensing.

In embodiments, an LED controller, implemented via FPGA, DSP, and/or microcontroller, performs the following steps repeatedly to continuously check for presence of an external object (such as the hand of a user):

Turn off (disable) infrared LEDs;

Detect a first level of received infrared light;

Turn on (activate) infrared LEDs;

Detect a second level of received infrared light;

Compute a difference between the first level and the second level; and

Assert a presence signal in response to the difference exceeding a predetermined threshold.

Figure 10:
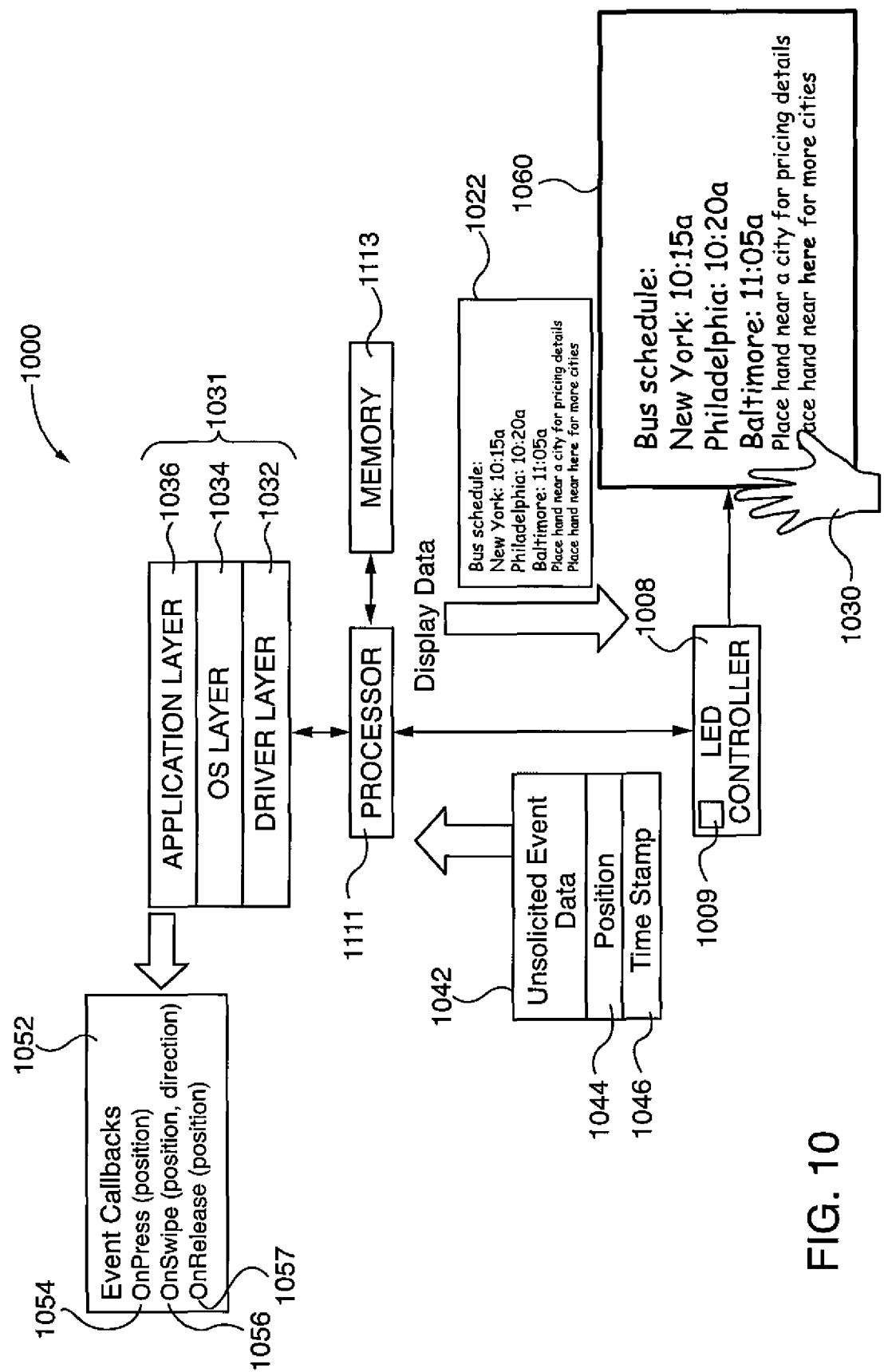
FIG. 10 is a block diagram showing data processing in accordance with embodiments of the present invention.

The presence signal may then generate unsolicited event data, such as shown at 1042 of FIG. 10. Embodiments can include controlling the light emitted from LEDs in an array with infrared sensors where each LED is controlled by measuring voltage discharge rate using a programmable integrated circuit such as an FPGA, DSP (Digital Signal Processor), and/or microcontroller by the following steps:

1) Drive the output high, charging the internal capacitance of the LED

2) Disable the output drive, turning the I/O pin into a high impedance input

3) Start a counter, running from some fixed frequency

4) Increment the counter until the input changes from digital '1' to digital '0'

The value in the counter will now correlate to the amount of radiation falling on the LED.

Figure 4A:
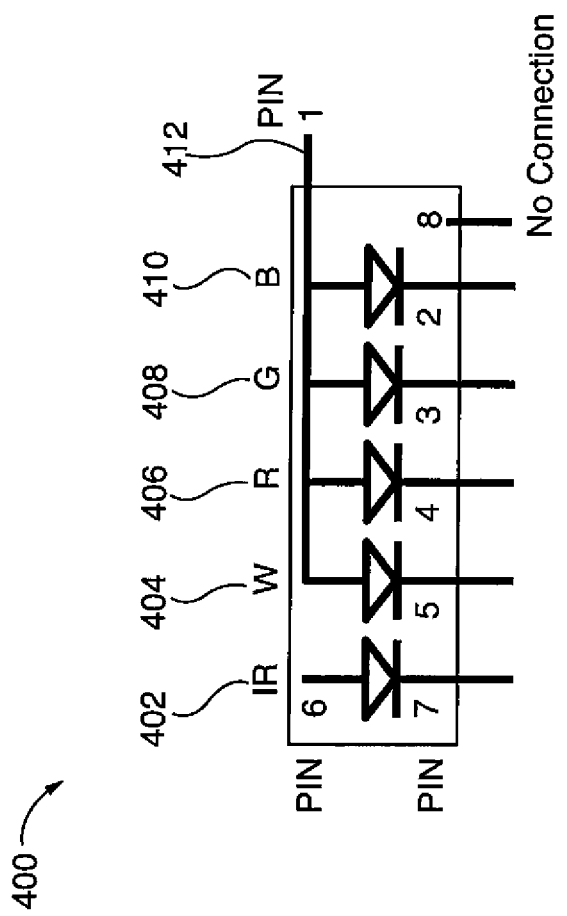
FIGS. 4A-4C show LED packages in accordance with embodiments of the present invention.
Figure 4B:
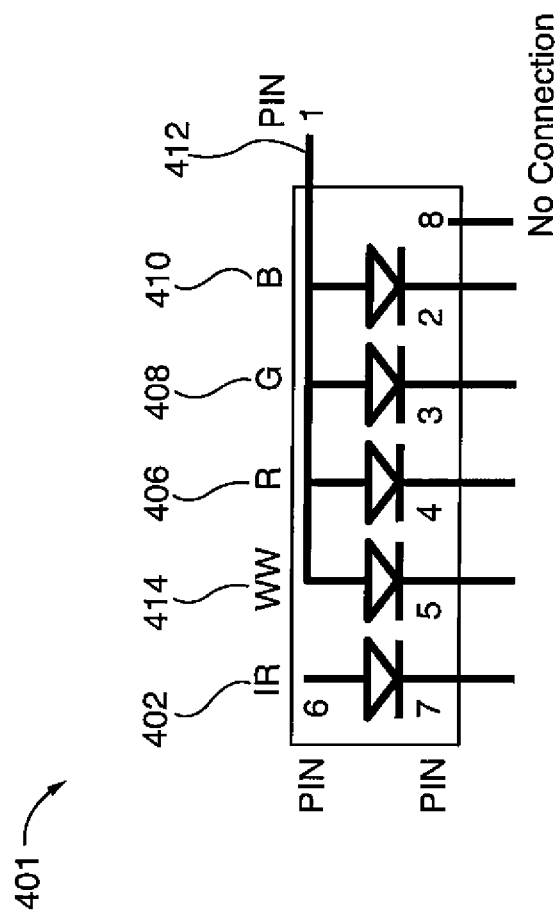
Figure 4C:
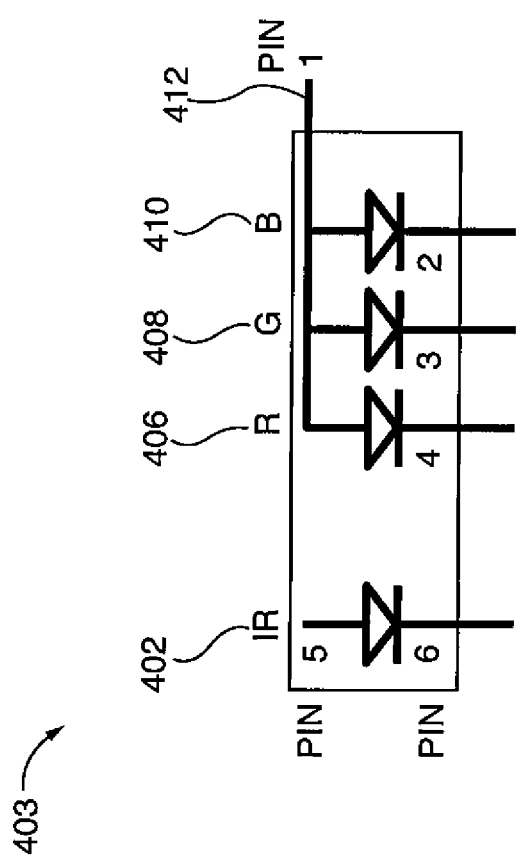

FIGS. 4A-4C show LED packages in accordance with embodiments of the present invention. Referring now to FIG. 4A, an LED package 400 is shown. LED package 400 includes an infrared (IR) LED 402, a white LED 404, a red LED 406, a green LED 408, and a blue LED 410. The visible-light LEDs have a common connection 412. The IR LED has a dedicated input and output connection to be configured for reverse-bias or forward-bias, independently of the visible-light LEDs. FIG. 4B shows an LED package 401. LED package 401 is similar to LED package 400, with the key difference being the use of warm white LED 414 in place of white LED 404. Some embodiments may include both white and warm white LEDs. FIG. 4C shows an LED package 403. LED package 403 does not include a white or warm white LED. Instead, white colors are created by various combinations of light from the red LED 406, green LED 408, and blue LED 410.

Embodiments can include an LED (Light Emitting Diode) package comprising: an infrared LED; a red LED; a green LED; and a blue LED; wherein the red LED, blue LED, and green LED are forward biased to be configured as transmitters. Embodiments can also include a white LED, wherein the white LED is forward biased to be configured as a transmitter. Embodiments can also include a warm white LED, wherein the warm white LED is forward biased to be configured as a transmitter. In embodiments, the infrared LED is reverse biased to be configured as a receiver. In embodiments the infrared LED is forward biased to be configured as a transmitter.

Figure 5:
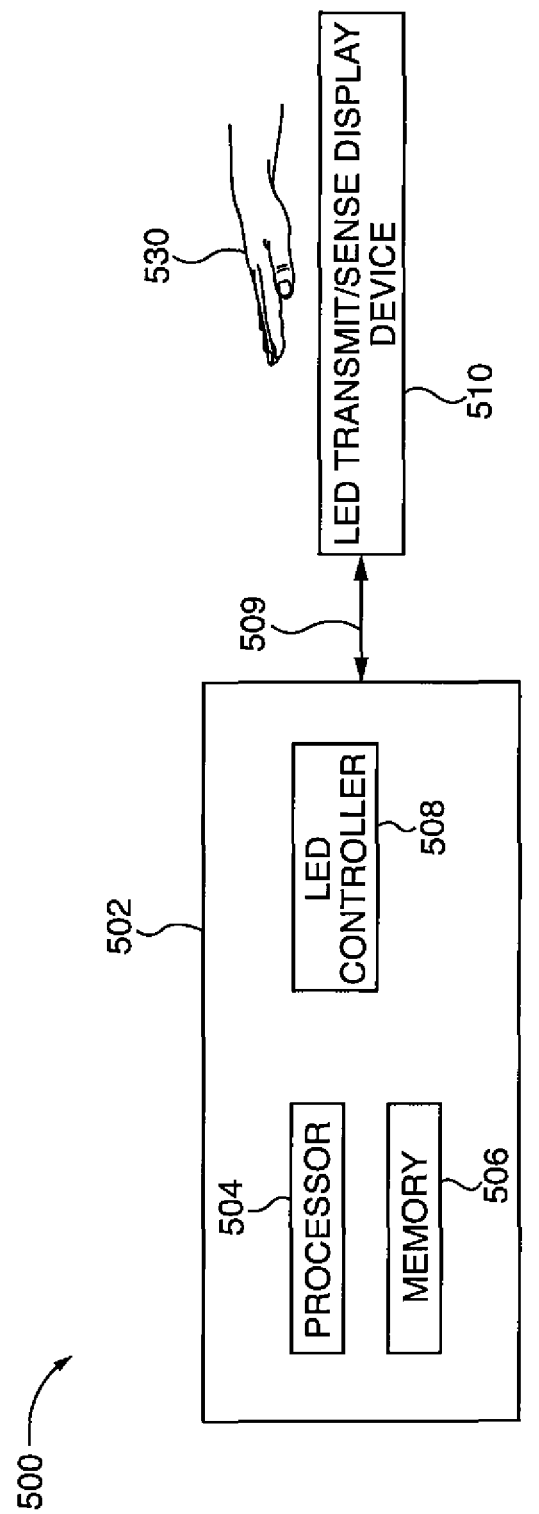
FIG. 5 is a block diagram showing hardware components of embodiments of the present invention.

FIG. 5 is a block diagram 500 showing hardware components of embodiments of the present invention. A control module 502 may include a processor 504. A memory 506 is coupled to the processor 504. The memory 506 may include non-transitory computer-readable mediums such as flash, read-only memory, static random-access memory (SRAM), optical memory, and/or other suitable memory types. The memory 506 contains instructions, that when executed by processor 504, perform steps in accordance with embodiments of the present invention.

An LED (Light Emitting Diode) controller 508 is coupled to the processor 504. The LED controller 508 may interface to the processor 504 via dedicated input/output (I/O) lines, or a communication bus such as 12C or similar. The LED transmit/sense device 510 comprises a substrate with multiple LED packages thereon, with a first subset of the LED packages configured as transmitters, and a second subset of the LED packages configured as receivers. An electronic connection 509 between the LED transmit/sense device 510 and the LED controller 508 enables transmission and reception of data to/from the LED transmit/sense device 510.

In embodiments, when a user places his hand 530 in proximity to the LED transmit/sense device 510, information pertaining to that occurrence is conveyed via connection 509. In embodiments, connection 509 can include a serial connection, parallel connection, or other suitable connection type.

FIG. 6A-6D show examples of a digital signage embodiment. Referring now to FIG. 6A, an electronic display 600 is shown in accordance with embodiments of the present invention. Display 600 includes multiple interactive regions, indicated generally as 602. The interactive regions are regions of the display 600 that comprise both IR-transmitter configured LED packages and IR-receiver configured LED packages. While display 600 shows only certain regions as being interactive (as indicated by shaded regions 602), in some embodiments, the entire display may be configured as interactive as shown in FIG. 6D with display 650, which has a full-screen interactive region, indicated as 607. Note that the interactive regions are generally not visible to the user, but illustrated in FIGS. 6A, 6B, and 6D for the purposes of explaining disclosed embodiments. Referring now to FIG. 6B, a digital signage example is shown. For the purposes of illustration, display data 604 is shown overlaid on the interactive regions 602. Referring now to FIG. 6C, an example of how the digital sign appears to a user is shown. The interactive regions are not necessarily visible to the user. In the example, based on instructions, the user is instructed to place a hand near a city to get additional information about a bus route for that city.

Figure 7A:
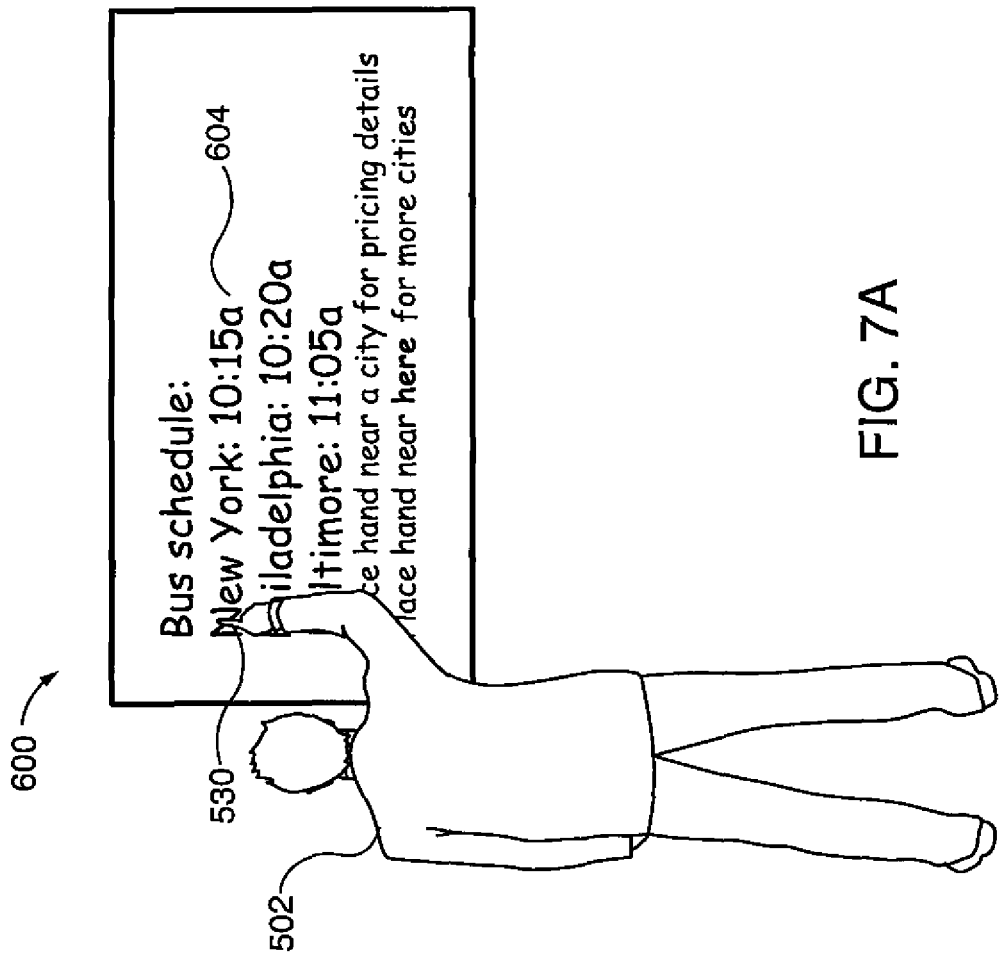
FIG. 7A-7B show example usage of the digital signage embodiment of FIG. 6C.
Figure 7B:
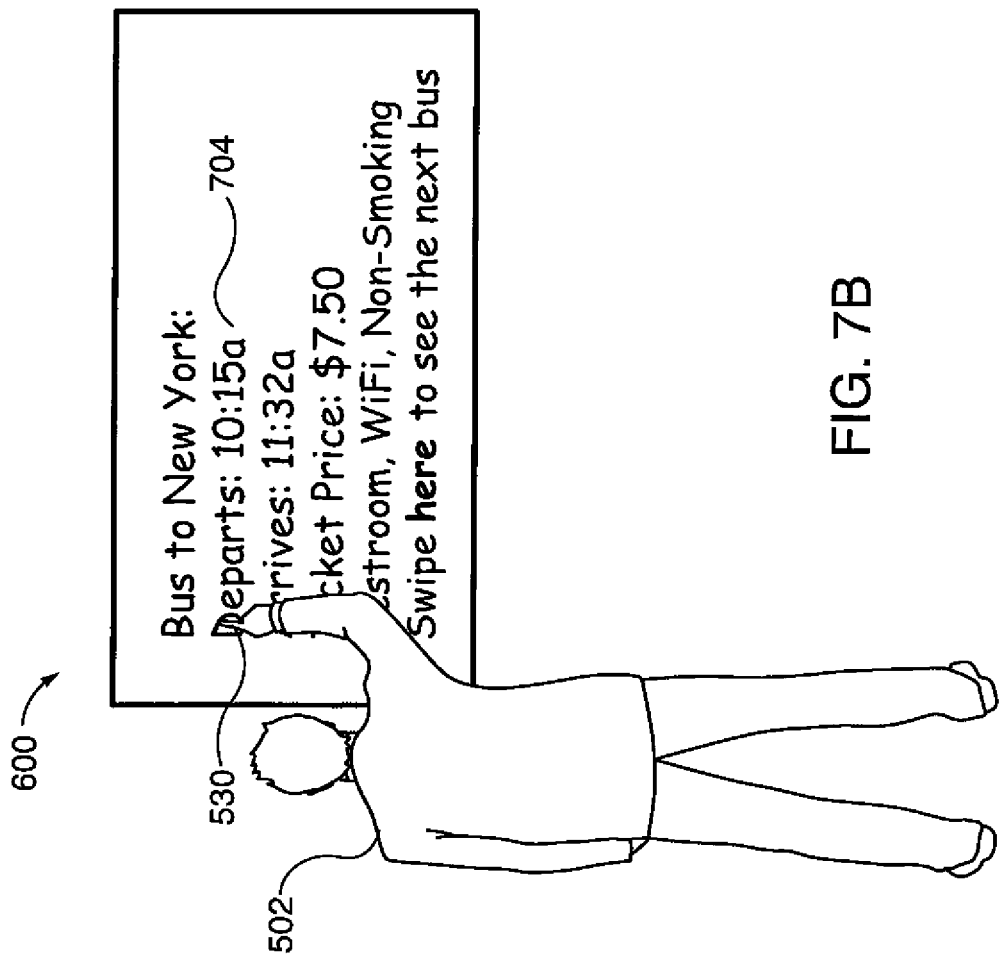

FIG. 7A-7B show example usage of the digital signage embodiment of FIG. 6C. Display 600 is showing display data 604, indicating bus information for various cities. Referring now to FIG. 7A, a user 502 places his hand 530 in proximity to the "N" of the word "New York" which is overlaid with interactive region 602 (see FIG. 6B). In response to the hand 530 in proximity, new display data 704 is rendered on the display 600 as shown in FIG. 7B, showing pricing, arrival time, and other details for the specific bus route.

FIG. 8 shows an example use of swiping in the digital signage embodiment of FIG. 6C. Referring again to FIG. 7B, the bottom line of text 707 says "Swipe here to see the next bus." Disclosed embodiment can recognize gesture movements such as swipes in addition to presence. To perform a swipe, the user moves his hand 530 relative to the display along a plane parallel to the display surface as indicated by arrow 808, and maintaining the hand 530 within the activation distance of the display. In embodiments, the swipe gesture is identified by comparing an activation time difference between two nearby IR receivers.

FIG. 9A and FIG. 9B show an example of swiping. FIG. 9A shows the position of a hand 930 over display 900 at a time t0, where it has activated IR receiver of LED package 902a, whereas IR receiver of LED package 902b is not activated, since arm 931 is further away from LED package 902b than the activation distance 921. FIG. 9B shows display 900 with a swipe at a later time t1 (t1>t0). At time t1, the hand 930 has moved in the direction indicated by arrow 925 from the position above LED package 902a to the position above LED package 902b as shown in FIG. 9B. In embodiments, each time an LED package activates (detects an increase in received IR light above a predetermined threshold), a timestamp from an internal clock (e.g. within processor 504) is associated with the activation. In embodiments, a transitional value is computed by subtracting the first timestamp from the second timestamp. The internal clock may be an integer counter based in milliseconds, microseconds, or other suitable time interval. If the absolute value of the transitional value is within a predetermined time range then the two activations are considered as a swipe gesture. In embodiments, the polarity (sign) of the transitional value can indicate direction of the swipe. Thus, in some embodiments, moving in the direction indicated by arrow 925 may indicate a positive transitional value when subtracting the timestamp associated with the activation of LED package 902a from the timestamp associated with the activation of LED package 902b. Conversely, moving in the direction opposite that indicated by arrow 925 may indicate a negative transitional value when subtracting the timestamp associated with the activation of LED package 902a from the timestamp associated with the activation of LED package 902b. In other embodiments, the position within a display of the LED package corresponding to the first activation is compared with the position within the display of the LED package corresponding to the second activation to determine the direction of the swipe. In this way, a user can swipe in different directions, such as "swipe right" or "swipe left" to get different information from a digital display in accordance with embodiments of the present invention.

FIG. 10 is a block diagram 1000 showing data processing in accordance with embodiments of the present invention. A software stack 1031 executes on processor 504 (FIG. 5). The software stack 1031 includes a driver layer 1032, an operating system (OS) layer 1034, and an application layer 1036. The driver layer 1032 may interface with the LED controller 1008 via a communications bus, I/O lines, and/or other suitable techniques. The driver layer may send display data 1022 to the LED controller 1008 for rendering on the electronic display 1060. In embodiments, the LED controller 1008 may be implemented using one or more FPGA devices, indicated generally as 1009. The LED controller 1008 may be coupled to processor 1111. In embodiments, the LED controller 1008 is coupled to the processor 1111 via a serial bus such as I2C. In some embodiments, the LED controller 1008 is coupled to the processor 1111 via one or more input/output (I/O) pins. Processor 1111 is coupled to memory 1113. Memory 1113 contains instructions, which may include software stack 1031, that when executed by the processor 1111, perform steps in accordance with disclosed embodiments. Memory 1113 may include dynamic random-access memory (DRAM), static random-access memory (SRAM), magnetic storage, and/or a read only memory such as flash, EEPROM, optical storage, or other suitable memory. In embodiments, the memory 1113 is a non-transitory computer-readable medium.

When a hand 1030 (or other object) is brought within the activation distance of the display such that the level of infrared light received by an IR receiver changes by a predetermined amount, an unsolicited event data message 1042 is sent from the LED controller 1008 to the driver layer 1032. In embodiments, an interrupt service routine (ISR) may be invoked by the processor to process an interrupt that an unsolicited event has occurred, and read the corresponding position 1044 and timestamp 1046 from the message. The driver layer 1032 may pass the information via the OS layer 1034 to an application layer 1036, which may generate one or more event callbacks 1052 based on the data. The application layer 1036 may determine if an event is a press, and generate an OnPress callback 1054. The application layer 1036 may determine that an event is a swipe event as described in FIG. 8-FIG. 9B, and generate an OnSwipe callback 1056. An OnRelease callback 1057 may be executed in response to a person removing his hand from the display, causing a deactivation event.

The callback functions can be used to send new display data 1022 to the electronic display 1060 based on a user action such as a press or swipe gesture. In this way, the electronic display can be interactive. Many applications for disclosed embodiments are possible. These applications can include informational (digital signage for schedules, directions, and the like), educational, and entertainment, among others.

The memory 506 contains instructions that when executed by the processor, cause the processor to detect a change in received infrared light exceeding a predetermined threshold for a predetermined duration, and in response to detecting the change, send a data message (1042), wherein the data message includes positional information (1044). In embodiments, the positional information 1044 may include an XY tuple, where X and Y represent Cartesian coordinates of the LED package within an electronic display. In other embodiments, the positional information 1044 may include an ordinal number representative of a location on the display. In embodiments, the data message further includes a timestamp (1046). The timestamp value may be in milliseconds, microseconds, or other suitable time interval.

Figure 11:
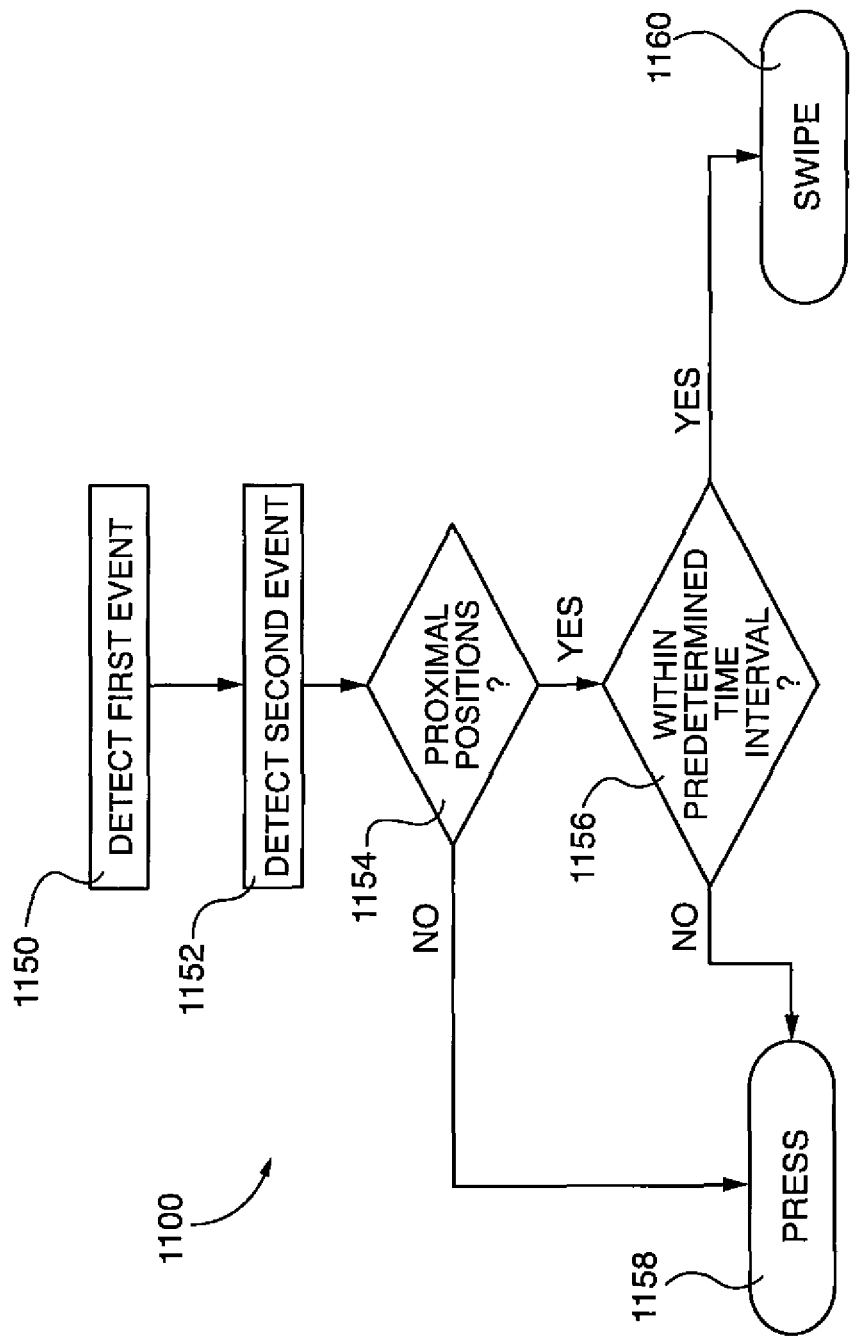
FIG. 11 is a flowchart indicating process steps for embodiments of the present invention.

FIG. 11 is a flowchart 1100 indicating process steps for embodiments of the present invention. At 1150, a first event is detected. In embodiments, this can include an activation of an IR receiver in an LED package. The activation is a condition in which the amount of IR light received surpasses a predetermined threshold. At 1152 a second event is detected. In embodiments, the second event can be a second activation at a different location. At 1154, a check is made to see if the LED package associated with the second event is proximal to the LED package associated with the first event. If no, then the events are treated as presses at 1158. If yes at 1154, then the events are proximal (near or adjacent each other), and the process continues to 1156, where a check is made to determine if the events occurred within a predetermined time interval. If yes at 1056, then the event is considered as a swipe (as illustrated in FIG. 9A and FIG. 9B), and the process continues to 1160. If no at 1056, then the event is considered as a press at 1158.

Another type of event is a deactivation. A deactivation is a condition in which the amount of IR light received falls below a predetermined threshold. This occurs when a user pulls his/her hand away from the electronic display. In embodiments, a deactivation event generates an OnRelease callback function (1057 of FIG. 10) to enable an application to take an action based on a user removing his/her hand (or foot in a floor-mounted embodiment) from a display.

In some embodiments, the memory further contains instructions, that when executed by the processor, cause the processor to detect a change in received infrared light at a first position that exceeds a predetermined threshold for a predetermined duration; in response to detecting the change, send a first data message, wherein the first data message includes positional information and a timestamp; detect a change in received infrared light at a second position that exceeds a predetermined threshold for a predetermined duration; and in response to detecting the change, send a second data message, wherein the second data message includes positional information and a timestamp. In embodiments, the amount of IR light received by an IR receiver is represented by a voltage detected by circuit 300. In embodiments, predetermined threshold ranges from 2.3 Volts to 3.5 Volts. In embodiments, the predetermined duration ranges from 100 milliseconds to 400 milliseconds.

In embodiments, the memory further contains instructions, that when executed by the processor, cause the processor to: compute a transitional value by subtracting the timestamp of the first data message from the timestamp of the second data message; and in response to an absolute value of a transitional value being less than a predetermined value, issuing a swipe event data message. In embodiments, the memory further contains instructions, that when executed by the processor, cause the processor to set a directional field within the data message based on a polarity of the transitional value. The processor 504 may perform other debouncing as appropriate to enable a responsive, yet not overly-sensitive display experience.

FIG. 12 shows another example of a digital signage embodiment providing user selection feedback. In this example, the text 1204 corresponding to the selection made by the user 502 is rendered in reverse text (as compared with 604 of FIG. 7A). This may be performed as functionality of the OnPress callback (1054 of FIG. 10). This provides feedback to the user that the user input was successfully received. In embodiments, a press event is generated when a reflected IR light signal is detected above a predetermined threshold for a predetermined duration. The press event causes the OnPress callback to be invoked.

As can now be appreciated, disclosed embodiments provide an LED package and electronic display that enable interactive functionality. Disclosed embodiments utilize a change in reflected IR light between an IR transmitter and an IR receiver to detect the proximity of a user (typically a hand or foot of the user). The interactive electronic displays can be mounted on walls, floors, tables, or other locations. The interactive electronic displays can be used for digital signage applications for information such as train and bus schedules. The interactive electronic displays can be used for providing directions in a shopping mall or on a college campus, as examples. The interactive electronic displays can be used for entertainment and gaming, such as an interactive dance floor, a "virtual soccer game," and many other applications. Thus, disclosed embodiments provide important improvements in the field of electronic displays.

Although the teachings of this disclosure have been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. An electronic display device, comprising:
a processor;
a memory coupled to the processor;
a Light Emitting Diode (LED) controller coupled to the processor;
a plurality of LED packages affixed to a substrate, wherein each LED package of the plurality of LED packages comprises:
an infrared LED;
a red LED;
a green LED; and
a blue LED;
wherein the red LED, blue LED, and green LED are forward biased to be configured as transmitters, and wherein:
a first subset of the plurality of LED packages are configured such that the infrared LED is reverse biased to be configured as a receiver and a second subset of the plurality of LED packages are configured such that the infrared LED is forward biased to be configured as a transmitter; and wherein the memory contains instructions, that when executed by the processor, cause the processor to:
detect a change in received infrared light exceeding a predetermined threshold for a predetermined duration; and
in response to detecting the change, send a data message, wherein the data message includes positional information and a timestamp.

2. The electronic display device of claim 1, wherein each LED package of the plurality of LED packages further comprises a white LED, and wherein the white LED is forward biased to be configured as a transmitter.

3. The electronic display device of claim 1, wherein each LED package of the plurality of LED packages further comprises a warm white LED, and wherein the warm white LED is forward biased to be configured as a transmitter.

4. The electronic display device of claim 2, wherein each LED package of the plurality of LED packages further comprises a warm white LED, and wherein the warm white LED is forward biased to be configured as a transmitter.

5. The electronic display device of claim 1, wherein the LED controller includes one or more FPGA devices.

6. The electronic display device of claim 5, wherein each FPGA device of the one or more FPGA devices is configured to:
disable one or more infrared LEDs;
detect a first level of received infrared light;
activate the one or more infrared LEDs;
detect a second level of received infrared light;
compute a difference between the first level and the second level; and
assert a presence signal in response to the difference exceeding a predetermined threshold.

7. An electronic display device, comprising:
a processor;
a memory coupled to the processor;
a Light Emitting Diode (LED) controller coupled to the processor;
a plurality of LED packages affixed to a substrate, wherein each LED package of the plurality of LED packages comprises:
an infrared LED;
a red LED;
a green LED; and
a blue LED;
wherein the red LED, blue LED, and green LED are forward biased to be configured as transmitters, and wherein:

a first subset of the plurality of LED packages are configured such that the infrared LED is reverse biased to be configured as a receiver and a second subset of the plurality of LED packages are configured such that the infrared LED is forward biased to be configured as a transmitter; and wherein the memory further contains instructions, that when executed by the processor, cause the processor to:
detect a change in received infrared light at a first position that exceeds a predetermined threshold for a predetermined duration;
in response to detecting the change, send a first data message, wherein the first data message includes positional information and a timestamp;
detect a change in received infrared light at a second position that exceeds a predetermined threshold for a predetermined duration; and
in response to detecting the change, send a second data message, wherein the second data message includes positional information and a timestamp.

8. The electronic display device of claim 7, wherein the memory further contains instructions, that when executed by the processor, cause the processor to:
compute a transitional value by subtracting the timestamp of the first data message from the timestamp of the second data message; and
in response to an absolute value of a transitional value being less than a predetermined value, issuing a swipe event data message.

9. The electronic display device of claim 8, wherein the memory further contains instructions, that when executed by the processor, cause the processor to set a directional field within data message based on a polarity of the transitional value.

10. The electronic display device of claim 7, wherein the memory further contains instructions, that when executed by the processor, cause the processor to generate a press event when a reflected IR light signal is detected above a predetermined threshold for a predetermined duration.

11. The electronic display device of claim 7, wherein each LED package of the plurality of LED packages further comprises a white LED, and wherein the white LED is forward biased to be configured as a transmitter.

12. The electronic display device of claim 7, wherein each LED package of the plurality of LED packages further comprises a warm white LED, and wherein the warm white LED is forward biased to be configured as a transmitter.

13. The electronic display device of claim 11, wherein each LED package of the plurality of LED packages further comprises a warm white LED, and wherein the warm white LED is forward biased to be configured as a transmitter.

14. The electronic display device of claim 7, wherein the LED controller includes one or more FPGA devices.

15. The electronic display device of claim 14, wherein each FPGA device of the one or more FPGA devices is configured to:
disable one or more infrared LEDs;
detect a first level of received infrared light;
activate the one or more infrared LEDs;
detect a second level of received infrared light;
compute a difference between the first level and the second level; and
assert a presence signal in response to the difference exceeding a predetermined threshold.

* * * * *